(12) United States Patent
Son

(10) Patent No.: US 7,129,023 B2
(45) Date of Patent: Oct. 31, 2006

(54) PHOTORESIST POLYMER AND PHOTORESIST COMPOSITION CONTAINING THE SAME

(75) Inventor: Min Seok Son, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 11/124,937

(22) Filed: May 9, 2005

(65) Prior Publication Data

US 2005/0244748 A1 Nov. 3, 2005

(30) Foreign Application Priority Data

Jul. 30, 2004 (KR) ...................... 10-2004-0060267

(51) Int. Cl.
*G03F 7/038* (2006.01)
*C08G 77/00* (2006.01)
*C08F 20/10* (2006.01)

(52) U.S. Cl. ............... 430/281.1; 430/285.1; 525/29; 526/318; 528/10; 528/41

(58) Field of Classification Search ............ 430/281.1, 430/285.1; 525/29; 526/318; 528/10, 41
See application file for complete search history.

(56) References Cited

U.S. PATENT DOCUMENTS 5,976,759 A * 11/1999 Urano et al. ............. 430/270.1
6,444,408 B1 * 9/2002 Brock et al. ................ 430/322
6,818,378 B1 * 11/2004 Endo ........................ 430/270.1
6,844,134 B1 * 1/2005 Choi et al. ................ 430/270.1
7,049,044 B1 * 5/2006 Gonsalves et al. ....... 430/270.1

* cited by examiner

Primary Examiner—Hoa Van Le
(74) Attorney, Agent, or Firm—Marshall, Gerstein & Borun LLP

(57) ABSTRACT

Photoresist polymers and photoresist compositions are disclosed. A photoresist polymer comprising a polymerization repeating unit represented by Formula 1 is less sensitive to change in the amount of energy due to its higher active energy than that of a conventional photoresist polymer. As a result, a phenomenon that a pattern of an outer field region that receives a relatively large amount of light becomes too thin is alleviated without additional dummy patterns when pattern is formed, and pattern collapse caused by a high aspect ratio due to high etching resistance is prevented.

Formula 1

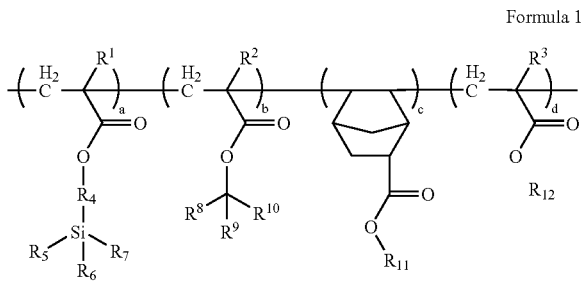

wherein
$R_1$–$R_{12}$, a, b, c and d are as defined in the description.

20 Claims, 2 Drawing Sheets

PHOTORESIST POLYMER AND PHOTORESIST COMPOSITION CONTAINING THE SAME

BACKGROUND

1. Technical Field

Photoresist polymers and photoresist compositions containing the same are disclosed that can improve profile of a photoresist pattern, without the need for any dummy patterns and which improve etch resistance during pattern formation.

2. Description of the Related Art

As manufacturing processes of semiconductor devices become more complicated and the degree of integration increases, methods for forming fine patterns are needed. Since it is difficult to obtain a fine pattern with conventional photolithography using KrF (248 nm), photolithography using far-infrared light source such as ArF (193 nm) has been developed. However, photoresist materials that have been used in ArF photolithography are more difficult to use than conventional photoresist materials. Specifically, as the critical dimension CD has been decreased by the high integration of semiconductor devices, the aspect ratio of a pattern is increased which can cause collapse the photoresist pattern 12 on the semiconductor substrate 11 as shown in FIG. 1.

There are many processes for forming layers of semiconductors. As the size of a pattern becomes smaller, a pattern in the outer region of a field or a block becomes remarkably smaller because the pattern in the outer region receives a relatively larger amount of light energy in comparison with the inside of the field of the block where patterns are arranged more uniformly and densely.

In order to prevent the outer portions of the pattern from being reduced in size, the amount of energy or an exposure condition of lens has been regulated. However, this conventional method does not solve the problem.

In addition, problems arise when the margins of DOF (Depth of Focus) and EL (Energy Latitude) become smaller as the pattern becomes smaller. However, these problems cannot be solved by using the change of exposure conditions. Also, it is difficult to secure etching resistance because the thickness of the photoresist film is reduced to prevent pattern collapse.

SUMMARY OF THE DISCLOSURE

Disclosed herein are photoresist polymers and photoresist compositions comprising the same that can improve a profile of an outer region of a field or a block which receives a relatively large amount of light when a pattern is formed. The disclosed photoresist polymers and compositions also enhance etching resistance.

Disclosed herein is a method for forming a phtoresist pattern using the disclosed photoresist composition. Also, disclosed herein is a semiconductor device obtained by the disclosed method.

BRIEF DESCRIPTION OF THE DRAWINGS

For a more complete understanding of this disclosure, reference should be made to the following detailed description and accompanying drawings, wherein.

DETAILED DESCRIPTION OF THE PRESENTLY PREFERRED EMBODIMENTS

Figure 1:
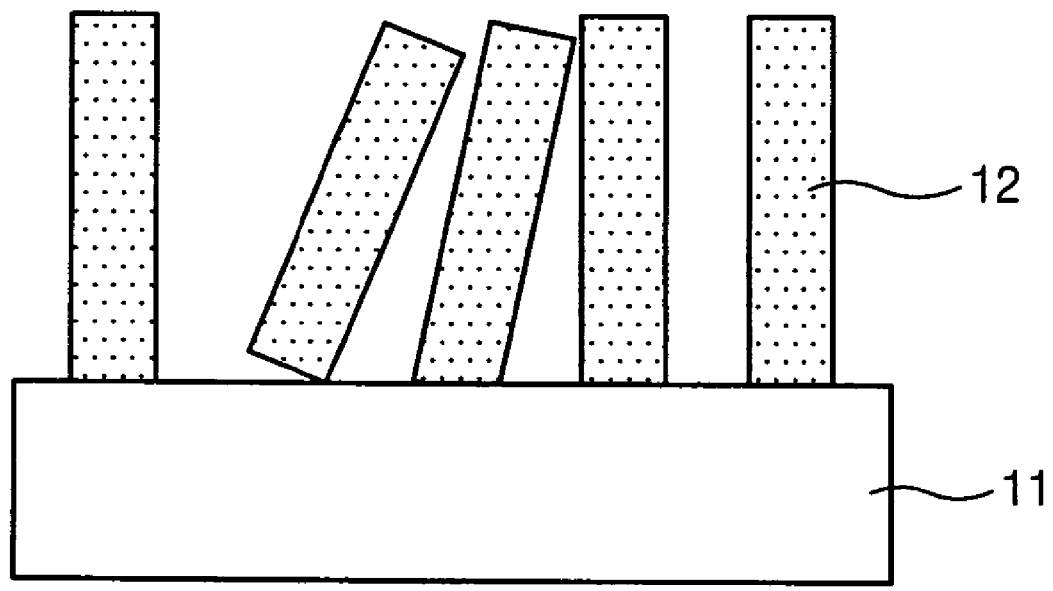
FIG. 1 is a diagram illustrating a pattern formed using a conventional photoresist polymer.

A disclosed photoresist polymer comprises a polymerization repeating unit represented by Formula 1:

Formula 1

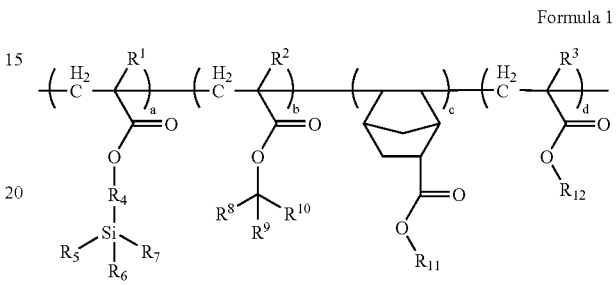

wherein $R_1$, $R_2$ and $R_3$ are individually H or $CH_3$;

$R_4$ is linear or branched $C_3$–$C_{10}$ alkylene group;

$R_5$, $R_6$ and $R_7$ are individually $C_1$–$C_3$ alkoxy group;

$R_8$, $R_9$ and $R_{10}$ are individually H or $CH_3$;

$R_{11}$ is linear or branched $C_1$–$C_3$ alkyl group; $R_{12}$ is hydrogen; and, a ratio of a:b:c:d falls within a range of 20~40 mol %:20~35 mol %:15~25 mol %:15~20 mol %.

The polymer has a molecular weight ranging from 1,000 to 10,000, preferably from 1,500 to 4,000.

Preferably, the polymerization repeating unit represented by Formula 1 is represented by Formula 1a:

Formula 1a

In the disclosed photoresist polymer, a monomer constituting the repeating unit "a" has a long chain by introducing linear or branched $C_3$–$C_{10}$ alkylene structure to prevent steric hindrance between end groups, thereby facilitating polymerization of polymers. Also, the monomer of the repeating unit "a" contains a large percentage of silicon and carbon to improve hardness of photoresist. Additionally, increase of etching resistance due to introduction of a silicon group allows a photoresist film having a lower thickness to serve as an etching mask in an etching process using a $CF_4$ plasma gas.

A monomer constituting the repeating unit "b" comprises a methyl group added in a basic structure to improve the etching resistance of the polymer, and has a strong cohesive force because connection of other carbons located adjacent to a COO— group is not linear. In the above-described monomer, since the phenomenon that the profile becomes thinner is lessened as the amount of light becomes larger due to its high active energy, sensitivity is reduced in response various exposure conditions.

A monomer constituting the repeating unit "c" improves the etching resistance, and the repeating unit "d" improves an adhesive force of the polymer to the wafer.

If the disclosed photoresist polymer is used, collapse of patterns can be prevented even when the thickness of ArF photoresist is formed at below 4,000 Å to reduce the aspect ratio. Additionally, the etching resistance is increased by a hardened layer, thereby facilitating formation of a pattern of a bottom underlying layer. As a result, a pattern having a high resolution can be formed.

The disclosed photoresist polymer can be prepared using a radical polymerization reaction which is performed with a bulk polymerization reaction or a solution polymerization reaction.

In the solution polymerization reaction, a polymerization solvent can be selected from the group consisting of tetrahydrofurane, cyclohexanone, cyclopentanone, dimethylformamide, dimethylsulfoxide, methylethylketone, dioxane, benzene, toluene, xylene and mixtures thereof.

Additionally, a polymerization initiator of the polymerization reaction is preferably selected from the group consisting of 2,2'-azobisisobutyronitrile (AIBN), benzoyl peroxide, acetylperoxide, laurylperoxide, t-butylperacetate, t-butylhydroperoxide, di-t-butylperoxide and mixtures thereof.

A disclosed photoresist composition comprises the photoresist polymer of Formula 1, a photoacid generator and an organic solvent.

Any of conventional photoacid generators, which are able to generate acids when they are exposed to light, can be used. Some of conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Sulfide type or onium type compounds are mainly used for the photoacid generator. The photoacid generator having low absorbance at 157 nm and 193 nm is preferably used. The photoacid generator may be one or more compounds selected from the group consisting of phthalimidotrifluoromethane sulfonate, dinitrobenzyltosylate, n-decyl disulfone, naphthylimido trifluoromethane sulfonate, diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate and dibutylnaphthylsulfonium triflate. Preferably, the photoacid generator is present in an amount ranging from 0.01 wt % to 5 wt % based on the photoresist polymer. If the photoresist generator is present in the amount of less than 0.01 wt %, it lowers photosensitivity of the photoresist composition to light. If the photoacid generator is present in the amount of more than 5 wt %, it can result in a poor pattern formation due to its high absorption of far ultraviolet rays and the generation of acid.

Any of conventional organic solvents can be employed on generating the photoresist composition, and some of the conventional solvents are also disclosed in the documents described above. Preferably, the organic solvent is selected from the group consisting of diethyleneglycoldiethylether, methyl 3-methoxypropionate, ethyl 3-ethoxypropionate, propyleneglycol methyletheracetate, cyclohexanone, 2-heptanone, ethyl lactate and mixtures thereof. The organic solvent is present in an amount ranging from 100 wt % to 1,500 wt % based on the photoresist polymer present.

A method for forming a photoresist pattern, comprises:

(a) forming a photoresist film by coating the disclosed photoresist composition;

(b) soft-baking the photoresist film;

(c) exposing the baked photoresist film to light;

(d) post-baking the exposed photoresist film; and (e) developing the resulting structure to obtain a photoresist pattern.

In step (a), the thickness of the photoresist film preferably ranges from 1,500 Å to 3,000 Å. The soft baking process of step (b) is performed at a temperature ranging from 80° C. to 150° C., preferably from 60° C. to 120° C. Preferably, the post baking process of step (d) is performed at a temperature ranging from 90° C. to 200° C.

The exposure process of step (c) is performed using the light selected from the group consisting of I-line (365 nm), KrF (248 nm), ArF (193 nm), $F_2$ (157 nm), EUV (13 nm), E-beam, X-ray and ion beam with an exposure energy ranging from 1 mJ/cm² to 100 mJ/cm².

The developing process of step (e) is preferably performed using an alkaline developing solution such as TMAH aqueous solution in an amount ranging from 0.01 to 5 wt %, preferably of 2.38 wt %.

The underlying layer is preferably selected from the group consisting of an oxide film such as BPSG (boron phosphorous silicate glass; a nitride film; a metal film such as aluminum, tungsten, cobalt or titanium; an organic anti-reflective coating film; and an inorganic anti-reflective coating film.

Figure 2:
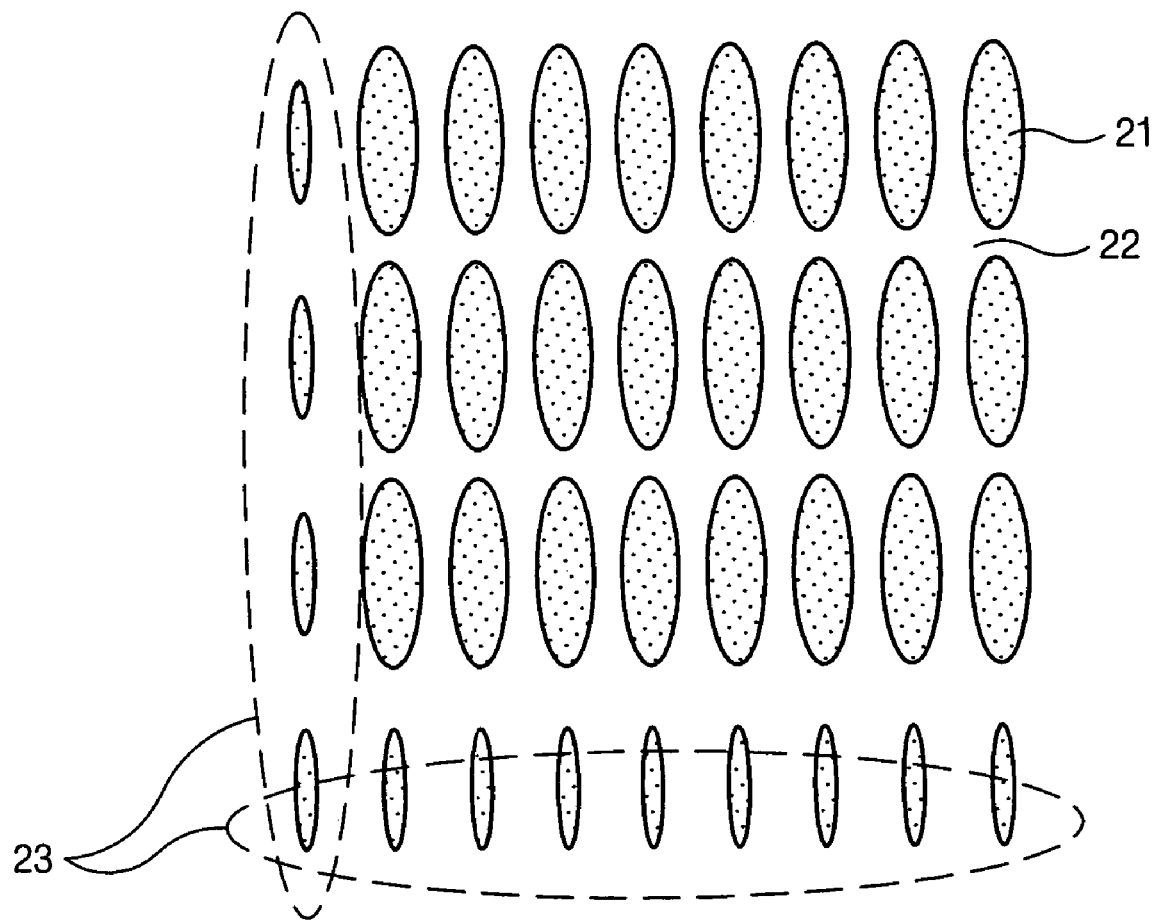
FIG. 2 is a diagram illustrating a process for obtaining an improved pattern profile of an outer region of a field using a disclosed photoresist polymer.

Referring to FIG. 2, when patterns of various layers are formed using a common ArF photoresist, the same amount of light energy is irradiated on the entire field. An outer region 21 of a field or a block receives a relatively large amount of light energy because the amount of light reflected in the empty region of the outer region becomes larger, so that the photoresist film is reduced. However, since the disclosed photoresist polymer has a high active energy and a relatively small sensitivity to light energy, it is not necessary to form an unnecessary dummy pattern in the outer region, and the lowering of productivity due to a dummy exposure is eliminated.

The disclosed photoresist polymer can prevent pattern collapse generated when the width of the pattern becomes narrower and the aspect ratio becomes larger because even a disclosed photoresist film having a reduced thickness serves as an etching mask due to increase of the etching resistance by introduction of a silicon group.

Also, there is provided a semiconductor device manufactured by using the disclosed method for forming the photoresist pattern.

The disclosed photoresist polymers and photoresist compositions containing the same will be described in greater detail by referring to examples below, which are not intended to be limiting.

EXAMPLE 1

Preparation of Photoresist Polymer

To 25 ml of tetrahydrofuran in 100 ml of a round-shaped flask were added 5 g of 3-(trimethoxysilyl)propyl methacrylate, 4 g of t-butyl methacrylate, 3 g of methyl 5-norbornene-2-carboxylate and 1 g of methacrylic acid. Then, 0.13 g of AIBN (azobisisobutyronitrile) as a polymerization initiator was added to the resulting mixture, and reacted at 67° C. under a nitrogen atmosphere for 24 hours. Next, the resulting mixture was cooled at room temperature, and poured into a beaker including 500 ml of ethyl ether to precipitate the resulting mixture. Thereafter, the precipitate was filtered and dehydrated at room temperature, thereby obtaining poly(3-(trimethyoxysilyl)propyl methacrylate/t-butyl methacrylate/methyl 5-norbornene-2-carboxylate/methacrylic acid) having a molecular weight of 1,900 represented by Formula 1a (yield: 46%).

EXAMPLE 2

Preparation of Photoresist Composition

To 50 g of methyl 3-methoxypropionate as an organic solvent were added 10 g of poly(3-(trimethyoxysilyl) propyl methacrylate/t-butyl methacrylate/methyl 5-norbornene-2-carboxylate/methacrylic acid) obtained from Example 1 and 0.1 g of triphenylsulfonium triflate as a photoacid generator. Then, the resulting mixture was filtered through a 0.10 μm filter to obtain a disclosed photoresist composition.

EXAMPLE 3

Formation of Photoresist Patterns

The photoresist composition obtained from Example 2 was spin-coated on a silicon wafer to form a photoresist film, and soft-baked at 90° C. for 90 seconds. After baking, the photoresist was exposed to light using a KrF laser exposer, and then post-baked at 110° C. for 90 seconds. The baked wafer was developed in 2.38 wt % TMAH aqueous solution for 40 seconds to obtain a L/S pattern of 120 nm.

As described above, since the disclosed photoresist polymers are less sensitive to change in the amount of energy due to its higher active energy than that of conventional photoresist polymers, the phenomenon where an outer region of a pattern that receives a relatively large amount of light becomes thinner can be reduced or eliminated without any additional dummy patterns when a pattern is formed during a semiconductor manufacturing process, and pattern collapse caused by a high aspect ratio due to high etching resistance can be prevented.

Moreover, even when the proper amount of energy as determined through margin check is transmitted by change of consistency of illuminating system, the influence on a profile of the pattern is reduced. Therefore, the disclosed photoresist polymers and the photoresist compositions containing the same facilitate processes because the range of energy which can be applied to a process margin becomes broader, and represent the more improved resolution.

What is claimed is:

1. A photoresist polymer comprising a polymerization repeating unit represented by Formula 1:

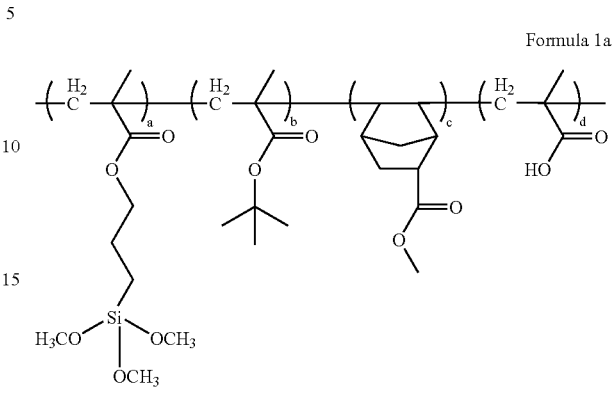

Formula 1a wherein $R_1$, $R_2$ and $R_3$ are individually H or $CH_3$;

$R_4$ is linear or branched $C_3$–$C_{10}$ alkylene group;

$R_5$, $R_6$ and $R_7$ are individually $C_1$–$C_3$ alkoxy group;

$R_8$, $R_9$ and $R_{10}$ are individually H or $CH_3$;

$R_{11}$ is linear or branched $C_1$–$C_3$ alkyl group;

$R_{12}$ is hydrogen; and, a ratio of a:b:c:d falls within a range of 20~40 mol %:20~35 mol %:15~25 mol %:15~20 mol %.

2. The photoresist polymer according to claim 1, wherein the polymer has a molecular weight ranging from 1,500 to 4,000.

3. The photoresist polymer according to claim 1, wherein the polymerization repeating unit represented by Formula 1 is represented by Formula 1a: Formula 1a

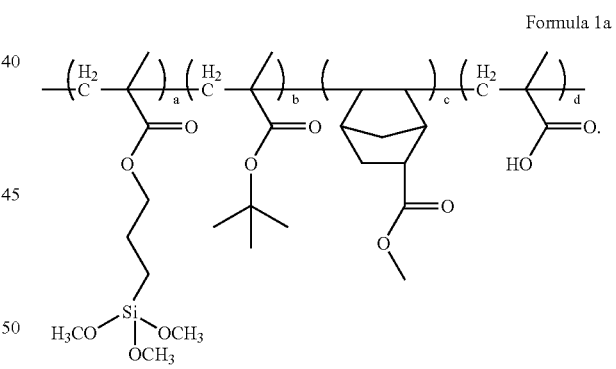

Formula 1a

4. A photoresist composition comprising the photoresist polymer described in claim 1, a photoacid generator and an organic solvent.

5. The photoresist composition according to claim 4, wherein the photoacid generator is one or more compounds selected from the group consisting of phthalimidotrifluoromethane sulfonate, dinitrobenzyltosylate, n-decyl disulfone, naphthylimido trifluoromethane sulfonate, diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, and mixtures thereof.

6. The photoresist composition according to claim 4, wherein the photoacid generator is present in an amount ranging from 0.01 wt % to 5wt % based on the photoresist polymer.

7. The photoresist composition according to claim 4, wherein the organic solvent is selected from the group consisting of diethyleneglycoldiethylether, methyl 3-methoxypropionate, ethyl 3-ethoxypropionate, propyleneglycol methyletheracetate, cyclohexanone, 2-heptanone, ethyl lactate and mixtures thereof.

8. The photoresist composition according to claim 4, wherein the organic solvent is present in an amount ranging from 100 wt % to 1,500 wt % based on the photoresist polymer.

9. A method for forming a photoresist pattern, comprising:
(a) forming a photoresist film by coating the photoresist composition of claim 4 on an underlying layer;
(b) soft-baking the photoresist film;
(c) exposing the baked photoresist film to light;
(d) post-baking the exposed photoresist film; and
(e) developing the resulting structure to obtain a photoresist pattern.

10. The method according to claim 9, wherein the soft baking process of step (b) is performed at a temperature ranging from 80° C. to 150° C.

11. The method according to claim 9, wherein the light of step (c) is selected from the group consisting of I-line (365 nm), KrF (248 nm), ArF (193 nm), $F_2$ (157 nm), EUV (13 nm), E-beam, X-ray and ion beam.

12. The method according to claim 9, wherein the exposing process of step (c) is performed at an exposure energy ranging from 1 mJ/cm$^2$ to 100 mJ/cm$^2$.

13. The method according to claim 9, wherein the post baking process of step (d) is performed at a temperature ranging from 90° C. to 200° C.

14. A semiconductor device manufactured using the method of claim 9.

15. A semiconductor device manufactured using the method of claim 10.

16. A semiconductor device manufactured using the method of claim 11.

17. A semiconductor device manufactured using the method of claim 12.

18. A semiconductor device manufactured using the method of claim 13.

19. A photoresist composition comprising the photoresist polymer of claim 2, a photoacid generator and an organic solvent.

20. The photoresist composition of claim 19, wherein the photoacid generator is one or more compounds selected from the group consisting of phthalimidotrifluoromethane sulfonate, dinitrobenzyltosylate, n-decyl disulfone, naphthylimido trifluoromethane sulfonate, diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, and mixtures thereof, and wherein the organic solvent is selected from the group consisting of diethyleneglycoldiethylether, methyl 3-methoxypropionate, ethyl 3-ethoxypropionate, propyleneglycol methyletheracetate, cyclohexanone, 2-heptanone, ethyl lactate and mixtures thereof.

* * * * *